United States Patent [19]

Prunier, Jr. et al.

[11] Patent Number: 5,145,833
[45] Date of Patent: Sep. 8, 1992

[54] METHOD FOR PRODUCING CERAMIC BODIES

[75] Inventors: Arthur R. Prunier, Jr.; Stanley F. Spangenberg; Sunil Wijeyesekera, all of Midland, Mich.

[73] Assignee: The Dow Chemical Company, Midland, Mich.

[21] Appl. No.: 494,938

[22] Filed: Mar. 14, 1990

Related U.S. Application Data

[60] Division of Ser. No. 242,934, Sep. 9, 1988, abandoned, which is a continuation-in-part of Ser. No. 828,802, Feb. 12, 1986, abandoned.

[51] Int. Cl.$^5$ .............................................. H01B 12/00
[52] U.S. Cl. ................................. 505/1; 264/56; 264/570; 264/332; 505/733; 505/739; 505/742
[58] Field of Search ..................... 264/332, 570, 56; 505/1, 733, 739, 742

[56] References Cited

U.S. PATENT DOCUMENTS

| | | | |
|---|---|---|---|
| 3,622,313 | 11/1971 | Havel | 75/226 |
| 4,081,272 | 3/1978 | Adlerborn | 75/223 |
| 4,428,906 | 1/1984 | Rozmus | 419/48 |
| 4,587,225 | 5/1986 | Tsukuma et al. | 501/103 |
| 4,601,877 | 7/1986 | Fujii et al. | 419/42 |
| 4,656,002 | 4/1987 | Lizenby et al. | 419/10 |
| 4,744,943 | 5/1988 | Timm | 419/10 |
| 4,843,059 | 6/1989 | Deslandes et al. | 505/1 |

FOREIGN PATENT DOCUMENTS 9000154  1/1990  PCT Int'l Appl. .

OTHER PUBLICATIONS

Chaklader et al., Studies on Ceramic Superconductors, Advanced Ceramic Materials, vol. Z, No. 3B, Special Issue, 1987.
Kelto, C. A., in Metals Handbook, vol. 7, pp. 542–546 (1984).
H. Sasakura et al., "Single High $T_c$ Phase Region of the Bi—Pb—Sr—Ca—Cu—O System", Japan Journal Applied Physics, vol. 28, No. 7, pp. L1163–L1166 (1989).
R. J. Cava et al., "Superconductivity Near 70K in a New Family of Layered Copper Oxides", Nature, vol. 336, pp. 211–214 (Nov. 17, 1988).
R. J. Cava et al., "Synthesis of Bulk Superconducting $YBa_2Cu_4O_5$ at One Atmosphere Oxygen Pressure", Nature, vol. 338, pp. 328–330 (1989).
Torardi et al., "Crystal Structure of $Tl_2Ba_2Ca_2Cu_3O_{10}$, a 125 K Superconductor" Science, vol. 240 (Apr. 29, 1988).
R. J. Cava et al. "Bulk Superconductivity at 91K in Single-Phase Oxygen-Deficient Perovskite YBa2-Cu3O7", Physical Review Letters, vol. 58, No. 16, pp. 1676–1679 (1987).
E. M. Engier et al., "Superconductivity Above Liquid Nitrogen Temperature: Preparation and Properties of a Family of Perovskite-Based Superconductors", Journal American Chemical Society, vol. 109, No. 9, pp. 2848–2849 (1987).
Superconductivity and its Applications, 20th Apr. 1988, pp. 94–99, H. S. Kwok et al., "Hot Isostatic Pressing (HIP) of Oxide Superconductors".

Primary Examiner—James Derrington
Attorney, Agent, or Firm—D. R. Howard

[57] ABSTRACT

This invention provides a process for producing a ceramic body by heating a ceramic material, such as particulate zirconium oxide, to a temperature greater than about 30 percent of the material's melting temperature, but less than said melting temperature, and thereafter applying sufficient isostatic pressure to consolidate the ceramic material into a body having a density of at least 85 percent of the theoretical density of the material.

This invention also provides a process for producing superconducting ceramic articles such as those represented by the general formula $YBa_2Cu_3O_{7-x}$ where $0 < x < 0.6$. Starting materials for such articles include sources of yttria, cupric oxide and barium monoxide. The general process parameters for the ceramic body process are modified to accomodate the starting materials. The ceramic body process is further modified by an optional precursor step wherein the starting materials are placed in a container and by certain finishing steps including annealing and cooling in the presence of oxygen.

This invention also concerns the ceramic body and the superconducting ceramic article prepared by the foregoing processes.

18 Claims, No Drawings

METHOD FOR PRODUCING CERAMIC BODIES

CROSS-REFERENCE TO RELATED APPLICATION

This is a division of application Ser. No. 07/242,934, filed 9/9/88, now abandoned, which is a continuation-in-part of application, Ser. No. 828,802, filed Feb. 12, 1986 now abandoned.

BACKGROUND OF THE INVENTION

This invention concerns a novel process for producing ceramic bodies and the ceramic bodies produced by the process. This invention also concerns a novel process for converting certain inorganic starting materials into ceramic bodies suitable for use in superconductive applications.

Some methods known for preparing ceramic bodies involve (a) hot pressing of powdered or compacted samples in a close-fitting, rigid mold or (b) hot isostatic pressing ("hipping") a sealed, deformable container having disposed therein a powdered or compacted sample utilizing a gas as the pressure-transmitting medium. In both of these methods, the sample, whether originally a powder or compact, assumes the shape of the mold or deformed container. Several problems are encountered when such methods are used. For example, the sizes and shapes of articles that can be produced are limited. In addition, finished ceramic bodies having complex shapes often contain undesirable density gradients because of nonuniform pressure distribution during pressing. Also, each sample must be compressed in a separate mold or container and, after hot pressing, the sample often adheres to the mold or container during separation.

Isostatic pressing of self-sustaining compacts (e.g., ceramic preforms) has been suggested as a possible method of overcoming the above-mentioned problems. For example, U.S. Pat. No. 3,279,917 discloses the use of a particulate material such as powdered glass or graphite as a pressure-transmitting medium in the hot pressing of refractory bodies. In this method, the particulate pressure-transmitting medium does not conform completely to the sample. As a consequence, pressure is still not transmitted uniformly and truly isostatically. Various shapes such as cubes, round rods and the like are distorted when nonuniform pressure is applied. It is therefore quite difficult, if not virtually impossible, to form intricate contours by this method.

U.S. Pat. No. 3,455,682 discloses an improved method of hot isostatically pressing (i.e., "hipping") refractory bodies which comprises the following steps: (A) surrounding the body with a mixture consisting essentially of from 5 percent to 40 percent by weight of a first component selected from alkali and alkaline earth metal chlorides, fluorides and silicates and mixtures thereof and from 60 to 95 percent by weight o a second component selected from silica, alumina, zirconia, magnesia, calcium oxide, spinels, mullite, anhydrous aluminosilicates and mixtures thereof: (B) heating said mixture to a temperature at which it is plastic: and (C) while maintaining said temperature, applying to said mixture sufficient pressure to increase the density of said body. It is taught that in this manner, low porosity, refractory bodies having a variety of shapes and sizes can be compressed to extremely low porosity and very high density without substantially altering their original shape.

U.S. Pat. No. 4,428,906 discloses a method for densifying material of metallic and nonmetallic compositions and combinations thereof to form a densified compact of a predetermined density. A quantity of such material which is less dense than the predetermined density, is encapsulated in a pressure-transmitting medium. External pressure is applied to the entire exterior of the medium to cause the predetermined densification of the encapsulated material. Densification occurs by way of hydrostatic pressure applied by the medium in response to the medium being substantially fully dense and incompressible but capable of fluidic flow, at least just prior to the predetermined densification. The invention is characterized by utilizing a pressure-transmitting medium of a rigid interconnected skeletal structure, which is collapsible in response to a predetermined force, and fluidizing means capable of fluidity. The fluidizing means is supported by and retained within the skeletal structure. The fluidizing means and the skeletal structure form a composite of skeletal structure fragments dispersed in the fluidizing means in response to collapse of the skeletal structure at the predetermined force The predetermined force renders the composite substantially fully dense and incompressible and fluidic at the predetermined densification of the compact.

U.S. Pat. No. 4,562,090 discloses a method of densifying a coating on a substrate by use of thermal and compressive stresses using a gas or solid pressure transfer medium. The substrates are steels, metal alloys or metals or non-ferrous metal alloys. The coatings are metal alloys, metals, particularly high wear and corrosion resistant metal alloys.

Surprisingly, the present invention provides a process for densifying ceramic materials by use of a combination of heat and isostatic pressure which results in a densified ceramic body, which can be in any highly complex shape at a density at a least 85 percent of theoretical density.

SUMMARY OF THE INVENTION

One aspect of this invention provides a process for producing a ceramic body comprising:

(a) heating a ceramic material to a temperature of more than about 30 percent of the melting temperature of said material but less than said melting temperature: and (b) applying to said ceramic material isostatic pressure, said pressure being greater than or equal to 50,000 psi ($3.45 \times 10^2$ MPa) but less than a pressure at which said ceramic material fractures, while maintaining the above temperature, for a period of time sufficient to increase the density of said ceramic material to form a ceramic body of a predetermined density, said time being between about 0.1 second and about 10 minutes, provided that, at some point in the process prior to step (b), the ceramic material is at least partially contained in a pressure-transmitting medium which is fluidic when subjected to the pressure of step (b). The predetermined density is at least 85 percent of the material's theoretical density.

A related aspect of this invention is a high density ceramic body prepared by the present process. High density ceramic bodies comprising particulate zirconium oxide and possessing superior hardness are of particular interest.

Another aspect of this invention is a method for preparing a superconducting ceramic article comprising:

a. heating a powdered admixture of a source of yttria, a source of barium monoxide and a source of cupric oxide to a temperature which is high enough to allow the admixture to be densified under pressure to more than about 65 percent of the admixture's theoretical density but low enough to substantially preclude melting of the admixture:

b. applying to said heated admixture isostatic pressure which is greater than or equal to about 80,000 psi ($5.5 \times 10^2$ MPa) but less than a pressure at which said heated admixture fractures, for a period of time sufficient to form a densified article with a density of more than about 65 percent of the admixture's theoretical density, said period of time being from about 0.1 second to about ten minutes. The superconducting ceramic article so produced is suitably of the formula $YBa_2Cu_3O_{7-x}$ where $0<x<1$. X is beneficially $<0.6$, but $>0$.

In a related aspect, superconducting articles are prepared by substituting other rare earth metal oxides for yttrria. "Rare earth metal oxides", as used herein, refers to materials selected from the group consisting of lanthana ($La_2O_3$), neodymia ($Nd_2O_3$), samaria ($Sm_2O_3$), europium oxide ($Eu_2O_3$), gadolinia ($Gd_2O_3$), dysprosia ($Dy_2O_3$), holmium sesquioxide ($Ho_2O_3$), erbia ($Er_2O_3$), thulia ($Tm_2O_3$), ytterbia ($Yb_2O_3$) and lutetium oxide ($Lu_2O_3$).

In a second related aspect, further variation of the starting materials will produce other superconducting articles. Such other articles include those comprising compounds of the formula $A_2B_2-xCa_{n-1+y}Cu_{n+z}O_{4+2n}$, where A is bismuth and B is strontium or A is thallium and B is calcium, $0<x<1$, $0<y<1$, $-1<z<1$ and n is an integer, beneficially from 1 to 10, desirably 2 or 3. Other suitable, superconducting articles result from a substitution of up to 50 percent of the bismuth with lead or up to 38 percent of the calcium with yttrium.

In a third related aspect, additional variation of the starting materials will produce still more superconducting articles. These articles comprise compounds of the formula $TlBa_2-xCa_{n-1+y}Cu_{n+z}O_{4+2n}$, where $0<x<1$, $0<y<1$, $-1<z<1$ and n is an integer, beneficially from 1 to 10, desirably 2, 3 or 4: compounds of the formula $La_2-xBa_xCuO_y$ or $La_2-xSr_xCuO_y$ where $0<x<0.4$ and $3<y<5$: compounds of the formula $BaPb_1-xBi_xO_y$ where $0.05<x<0.3$ and $2<y<3$: or compounds of the formula $Ba_xK_yBiO_z$, where $0.5<x<0.7$, $0.4<y<0.8$ and $2<z<3$.

The superconducting ceramic articles prepared by this method are also included as part of the present invention.

DETAILED DESCRIPTION OF THE INVENTION

In general, any ceramic which comprises an inorganic, nonmetallic material as its essential component may be used to prepare a ceramic body in accordance with the process of this invention. Minor impurities may be present in the ceramic material so long as they do not substantially affect the densification of said material. Preferably, the ceramic material consists essentially of a ceramic, and more preferably, the ceramic material consists of a ceramic.

Useful ceramics include mixed ceramics such as cordierite. Preferred ceramics include oxides, carbides, nitrides, silicides, borides, sulfides and mixtures thereof. More preferred ceramics include magnesia, mullite, thoria, beryllia, urania, spinels, zirconium oxide, bismuth oxide, aluminum oxide, barium titanate, cordierite, boron nitride, tungsten carbide, tantalum carbide, titanium carbide, niobium carbide, zirconium carbide, boron carbide, hafnium carbide, silicon earbide, aluminum nitride, titanium nitride, zirconium nitride, tantalum nitride, hafnium nitride, niobium nitride, boron nitride, silicon nitride, titanium boride, chromium boride, zirconium boride. tantalum boride, molybdenum boride, tungsten boride, cerium sulfide, molybdenum sulfide, cadmium sulfide, zinc sulfide, titanium sulfide, magnesium sulfide, zirconium sulfide, as well as mixtures, alloys and composites thereof. Even more preferred ceramics include spinels, zirconium oxide, aluminum oxide, magnesium oxide, silicon carbide, cordierite, barium titanate, and boron nitride. Even more preferred ceramics are zirconium oxide, aluminum oxide and magnesium oxide. The most preferred ceramic is zirconium oxide. The zirconium oxide may be stabilized with yttrium oxide, magnesium oxide or with any other material having stabilizing properties. Less preferred, but acceptable, ceramics include indium oxide, chromium oxide, hafnium oxide, scandium oxide, niobium oxide, lanthanum oxide, tantalum oxide, yttrium oxide, ferrites, lead titanates, aluminum boride, silicon boride, molybdenum silicide, hafnium carbide, titanium carbide, niobium carbide, vanadium carbide, tantalum carbide, zirconium carbide, silicon nitride, ferrites, lead niobates, aluminum nitride, and mixtures or composites thereof.

Ceramic material compositions suitable for use in preparing superconducting articles include a source of yttria, a source of barium monoxide and a source of cupric oxide. The source of yttria is beneficially selected from the group consisting of yttria, yttrium acetate, yttrium carbonate, yttrium nitrate hexahydrate and yttrium nitrate tetrahydrate. The source of yttria is desirably yttria itself. The source of barium monoxide is beneficially selected from the group consisting of barium monoxide, barium acetate, barium acetate hydrate, barium peroxide, barium carbonate($\alpha$), barium carbonate(62 ), barium carbonate($\gamma$), and barium nitrate. The source of barium monoxide is desirably barium monoxide itself. The source of cupric oxide is beneficially selected from the group consisting of cupric oxide, cuprous oxide, copper acetate, copper carbonate, copper nitrate hexahydrate and copper nitrate trihydrate. The source of cupric oxide is desirably cupric oxide itself.

Superconducting articles also result when the aforementioned compositions are modified by substituting a source of a rare earth metal oxide other than yttria for the yttria. The rare earth metal oxides other than yttria include materials selected from the group consisting of lanthana ($La_2O_3$), neodymia ($Nd_2O_3$), samaria ($Sm_2O_3$), europium oxide ($Eu_2O_3$), gadolinia ($Gd_2O_3$), dysprosia ($Dy_2O_3$), holmium sesquioxide ($Ho_2O_3$), erbia ($Er_2O_3$), thulia ($Tm_2O_3$), ytterbia ($Yb_2O_3$) and lutetium oxide ($Lu_2O_3$). Sources for the rare earth metal oxides are both similar to those for yttria and readily determined by skilled artisans without undue experimentation.

In one preferred embodiment, the ceramic material to be densified is particulate and has a particle size of about 100 microns or less, more preferably about 10 microns or less: still more preferably about 1 micron or less and most preferably between 100 and 10,000 Angstroms. The description of preferred particle sizes is given for a substantially mono-modal particle size distribution. It will be recognized by those skilled in the art that small quantities of particles of considerably smaller size than the size of the main proportion of particulate may be intermixed therewith to achieve a higher packing density for a given degree of densification.

In one preferred embodiment of this invention, fibrous ceramic material or other reinforcing ceramic material may be mixed with the particulate ceramic material. It is believed that incorporation of fibrous ceramic material or other reinforcing ceramic material may increase the strength and fracture toughness of the ceramic body produced.

In accordance with the aspect of the present invention wherein a ceramic body is produced, the ceramic material may be compressed and shaped in a preliminary operation to preferably generate a ceramic preform having the desired shape of the final product. Said ceramic preform will preferably have sufficient density to substantially retain its shape during handling and further processing. In practice, the ceramic preform may be prepared by placing the ceramic material in a press and partially densifying the material by pressure application. The resulting partially densified material may be referred to as a ceramic preform. Such pressing is normally done under ambient temperatures. Internal lubricants such as waxes, or a material such as polyethylene, may be used during preparation of the ceramic preform to produce a higher density. An external lubricant, such as Methocel ® or zirconium nitride, may be used to prevent galling of a die punch in a press, (e.g., a uniaxial press). In one preferred embodiment, a rigid mold may be used to apply the pressure. Suitable pressures are generally between 200 psi (1.4 MPa) and 10,000 psi ($6.89 \times 10^1$ MPa). In another preferred embodiment, the ceramic material may be pressed directly in a steel or tungsten carbide die in a powder metallurgy press. In a third preferred embodiment, the ceramic material may be charged into a thin-walled rubber mold which is evacuated, sealed and subjected to isostatic pressure in a liquid medium at ambient temperatures and pressures of from 1,000 psi (6.89 MPa) to 30,000 psi ($2.1 \times 10^2$ MPa). In one preferred embodiment, the ceramic preform, prepared by any of the above processes, has a density of between 30 percent and 85 percent, more preferably between 60 and 85 percent.

The conditions at which the ceramic material is densified may be critical in the preparation of a ceramic body. Four desirable parameters are: (1) the additives to enhance binding, (2) the temperature at which the binding proceeds, (3) the pressure used to achieve such binding, and (4) the time period over which such pressure is applied. It is further desired that the pressure be applied in a substantially isostatic manner. Isostatic pressure refers herein to pressure which is applied evenly to all portions of the material to be densified, regardless of shape or size.

The particular additives, pressure, temperature and time to give the desired results are dependent upon the particular ceramic material chosen. Those skilled in the art may choose the appropriate additives, pressures, temperatures and times based upon the teachings contained herein.

Temperatures useful for preparing ceramic bodies in accordance with this invention are preferably between the lowest temperature at which the ceramic material is sufficiently plastic to permit compaction sufficient to achieve the desired density e.g., about 30 percent of the melting temperature of the ceramic material, and less than the melting temperature of said material, e.g., about 2000° C. and more preferably between about 30 percent and about 95 percent of the melting temperature of the ceramic material. The melting temperature may be measured in either degrees Centigrade or degrees Fahrenheit. Even more preferably, the temperature is between about 50 and about 70 percent of the melting temperature of the ceramic material. For purposes of this invention, the melting temperature is that temperature at which the ceramic material undergoes a phase change from a solid to a liquid state. In cases where the melting temperature is unknown, said temperature may be estimated by standard methods known to those skilled in the art. It must be recognized that the temperatures which are useful for a particular ceramic material may be dependent upon the properties of that material, and one skilled in the art would recognize those temperatures which are useful based upon the functional description provided. Preferably, the temperature is greater than that at which a pressure of about 100,000 psi ($6.9 \times 10^2$ MPa) will achieve at least 85 percent of the theoretical density within 2 seconds and less than that temperature at which the ceramic material undergoes recrystallization and grain growth. The preferred temperature for densifying zirconium oxide is about 1100° C.

When preparing ceramic bodies in accordance with the present invention, the pressure applied to the ceramic material is preferably between 50,000 psi ($3.45 \times 10^2$ MPa) and the fracture stress of said material: more preferably between 70,000 psi ($4.82 \times 10^2$ MPa) and said fracture stress: and most preferably between 100,000 psi ($6.89 \times 10^2$ MPa) and said fracture stress. Fracture stress, as referred to herein, is defined as that pressure which, when applied to a ceramic material, causes said material to fracture. It is believed that if true isostatic pressure is applied to the ceramic material, then said material will not fracture and therefore no fracture stress exists. However, due to mechanical imperfections and particle interactions in applying pressure to a ceramic material, said material may exhibit a fracture stress. The maximum pressure applied is preferably less than about 1,000,000 psi ($7.0 \times 10^3$ MPa), and more preferably less than about 450,000 psi ($3.1 \times 10^3$ MPa).

In a preferred embodiment of this invention, the pressure is preferably applied in a substantially isostatic manner and in an amount sufficient to permanently reduce the volume (i.e., densification) of the ceramic material. Preferably, the pressure is applied in an amount sufficient to densify the ceramic material to at least 85 percent of theoretical density in less than 15 minutes at a temperature below the melting temperature of the ceramic material. Although satisfactory results may be obtained when pressure is applied for longer time periods, e.g.. up to an hour or more, it is believed that such time periods are uneconomical. More preferably the pressure is sufficient to accomplish the above-described densification in less than about 1 minute, even more preferably in less than about 10 seconds, and most preferably in less than about 5 seconds. A rate of pressure increase greater than about 1,000 psi/sec (6.89 MPa/sec) is preferred and a rate of pressure increase greater than 10,000 psi/sec ($6.89 \times 10^1$ MPa/sec) is more preferred. It is believed that if the pressure used is too high, the ceramic bodies prepared may fracture and if the pressure used is too low, the ceramic bodies prepared may have a density too low for desired uses.

In accordance with this invention, pressure is applied for a sufficient time to densify the ceramic material to a predetermined density. The time in which the ceramic material is exposed to the desired pressure is preferably between that time sufficient for said material to reach at least 85 percent of its theoretical density and that time in which the ceramic material fractures. The pressure applied to the ceramic material to effect densification is preferably sustained for a period of time greater than 0.1 second. It is believed that the application of sustained pressure to the ceramic material may cause creep or plastic deformation thereby resulting in an improved densification process. It has been discovered that times of between 0.01 second and one hour are generally suitable for achievement of the desired densification. The preferred time for achievement of the desired densification is between 0.01 second and 15 minutes; more preferred is between 0.1 second and 10 minutes: even more preferred is between 0.1 second and 1 minute: even more preferred is between about 0.1 second and about 10 seconds: still more preferred is between 0.5 second and 5 seconds and still more preferred is between 1 second and 5 seconds. The most preferred time is 2 seconds.

In accordance with that aspect of the present invention wherein a superconducting ceramic article is prepared, the process comprises two steps. In step one, a powdered admixture comprising a source of a rare earth metal oxide, a source of barium monoxide and a source of cupric oxide is heated to a temperature which is high enough to allow the admixture to be densified under pressure to more than about 65 percent of the admixture's theoretical density but low enough to substantially preclude melting of the admixture. The rare earth metal oxide is selected from the group consisting of yttria, lanthana ($La_2O_3$), neodymia ($Nd_2O_3$), samaria ($Sm_2O_3$), europium oxide ($Eu_2O_3$), gadolinia ($Gd_2O_3$), dysprosia ($Dy_2O_3$), holmium sesquioxide ($Ho_2O_3$), erbia ($Er_2O_3$), thulia ($Tm_2O_3$), ytterbia ($Yb_2O_3$) and lutetium oxide ($Lu_2O_3$). The rare earth metal oxide is beneficially yttria. When the rare earth metal oxide is yttria, the temperature is suitably from about 800° Centigrade to about 900° Centigrade, beneficially from about 850° Centigrade to about 875° Centigrade. Temperatures suitable for the other rare earth metal oxides are readily attainable without undue experimentation. In step two, isostatic pressure of between about 80,000 psi ($5.5 \times 10^2$ MPa) and about the fracture stress of the heated admixture is applied to said heated admixture for a period of time sufficient to form a densified article with a density of more than about 65 percent of the admixture's theoretical density. The pressure is suitably between about 90,000 psi ($6.2 \times 10^2$ MPa) and about 120,000 psi ($8.3 \times 10^2$ MPa). The density of the densified article is beneficially more than about 85 percent, desirably more than about 90 and preferably more than about 95 percent of the admixture's theoretical density. The period of time is beneficially from about 0.1 second to about ten minutes, desirably from about ten seconds to about five minutes.

A particularly desirable modification of the foregoing process involves a preliminary step wherein the powdered admixture is placed in a container before said admixture is heated. The container is beneficially fabricated from a material which is substantially fully dense and incompressible at room temperature, but capable of plastic flow at the elevated temperatures and pressures of steps one and two. The container preferably has defined therein a cavity having a shape approximating that of the resultant superconducting ceramic article. Suitable container materials include those metals from which the admixture components are derived as well as those which are substantially nonreactive with said admixture during this process. One such material is copper. Copper also offers other advantages such as ready availability and relatively low cost. In addition, copper and its reaction products with admixture components are either readily removed or of no concern as far as superconductive or mechanical properties of the resultant ceramic article are concerned.

Another desirable modification of the foregoing process concerns an additional step which beneficially follows the preliminary step of placing the admixture in a container. The additional step may also be inserted between steps one and two if desired. Irrespective of its placement in the process, the additional step comprises at least partially containing the powdered admixture in a pressure-transmitting medium which is fluidic when subjected to the pressure of step two.

The foregoing process beneficially also comprises a sequential step three wherein the densified article is annealed under conditions sufficient to convert it to a superconducting ceramic article. When the rare earth metal oxide is yttria, the superconducting ceramic article has a composition comprising $YBa_2Cu_3O_{7-x}$ where $0<x<0.6$. The conditions beneficially comprise heating the densified article in the presence of gaseous oxygen to a temperature of from about 850° Centigrade to about 1000° Centigrade and thereafter slowly cooling the heated, densified article, in the presence of gaseous oxygen, to a temperature of about 500° Centigrade. Cooling is beneficially at a rate of cooling which is sufficiently low to allow the densified article to absorb enough oxygen to render the article superconductive. The rate of cooling is suitably from about 0.5° to about 1.5° Centigrade per minute.

The foregoing process beneficially further comprises a sequential step four wherein the cooled, densified article is held at a temperature of from about 400° Centigrade to about 500° Centigrade in the presence of oxygen for a period of time sufficient to further increase the oxygen content of the densified article. Time periods of from about 15 minutes to about 48 hours produce satisfactory results.

In a modification of step one, a preformed composition selected from the group consisting of (a) compounds of the formula $YBa_2Cu_3O_{7-x}$, wherein $0<x<1$, (b) compounds of the formula $A_2B_{2-x}Ca_{n-1+y}Cu_{n+z}O_{4+2n}$, where A is bismuth and B is strontium or A is thallium and B is calcium, $0<x<1$, $0<y<1$, $-1<z<1$ and n is an integer, (c) compounds of the formula $TlBa_{2-x}Ca_{n-1+y}Cu_{n+z}O_{4+2n}$, where $0<x<1$, $0<y<1$, $-1<z<1$ and n is an integer, (d) compounds of the formula $La_{2-x}Ba_xCuO_y$ or $La_{2-x}Sr_xCuO_y$ where $0<x<0.4$ and $3<y<5$, (e) compounds of the formula $BaPb_{1-x}Bi_xO_y$ where $0.05<x<0.3$ and $2<y<3$, or (f) compounds of the formula $Ba_xK_yBiO_z$, where $0.5<x<0.7$, $0.4<y<0.8$ and $2<z<3$, is substituted for the powdered admixture of a source of a rare earth metal oxide, preferably yttria, a source of cupric oxide and a source of barium oxide. The preformed composition is beneficially a compound of the formula $YBa_2Cu_3O_{7-x}$, wherein $0<x<1$. Satisfactory results are also obtained with compounds of the formula $A_2B_{2-x}Ca_{n-1+y}Cu_{n+z}O_{4+2n}$, where A is bismuth, B is strontium and n is an integer $\geq$ one and $\leq$ ten, beneficially 2 or 3. If desired, up to 50 percent of the bismuth may be replaced by lead. As an alternative, up to 38 percent of the calcium may be replaced by yttrium.

The preformed composition may either be in the form of a powder or a greenware article. If in the form of a powder, all of the additional steps detailed herein may advantageously be employed. If in the form of a greenware article, the preliminary step of placing the composition in a container may, if desired, be eliminated.

The ceramic bodies and superconducting ceramic articles of this invention may be prepared in a substantially solid state process. A solid state process refers herein to a procedure whereby the ceramic material is densified while in a substantially solid state. The prior art teaches that the ceramic material may undergo recrystallization and agglomeration of the ceramic particles during densification resulting in large ceramic grain particles. It is believed that one advantage of this invention is that it allows significantly lower temperatures and, in some instances, times for densification of ceramic bodies thereby minimizing grain growth during densification.

It should be recognized that there are practical considerations which will dominate the selection of the proper time, temperature and pressure variables according to this invention. Generally, the time variable may be minimized (in terms of utility of this invention) to avoid getting into temperature/time ranges so high that appreciable reshaping and coarsening of the grain structure begins to occur. High pressure and high temperature both accelerate ceramic flow. Therefore, both should be maximized subject to the constraint that the grains should not appreciably increase in size. It is believed that at the particular temperatures and pressure used in this invention there may be enhanced mobility of dislocations in the ceramic body during densification. It will be evident to those skilled in the art that grain growth inhibitors may be used to extend the range of practice of this invention.

Isostatic pressure may be applied to the ceramic material or the ceramic preform. Various methods of applying isostatic pressure are known to those skilled in the art. All such methods which allow for the use of the preferred parameters of time, temperature and pressure as described hereinabove are useful.

One such preferred method of transmitting isostatic pressure to a material to be bound and densified is described in Rozmus, U.S. Pat. No. 4,428,906 (relevant portions incorporated herein by reference). The process described therein involves first placing the powder of the binder material and the ceramic material in the proportion desired in a container which is capable of performing as a pressure-transmitting medium at temperatures and pressures used for densification of the powders. That is, the container must be flexible or deformable yet maintain structural integrity at elevated temperatures. As noted herein, suitable container materials for use in preparing superconducting ceramic articles include those metals from which the admixture components or preformed compositions are derived as well as those which are substantially nonreactive with said admixture or preformed composition during the process. By way of illustration, copper is particularly suitable for compositions such as $YBa_2Cu_3O_{7-x}$ wherein $0 < x < 0.6$.

The container is suitably evacuated, e.g., with a vacuum or reduced pressure, prior to addition of the binder material and ceramic material thereto. The materials are suitably added under vacuum. The container, with the less dense powder therein, is then placed in a casting mold wherein a pressure-transmitting medium is cast about the container to encapsulate the entire container and the less dense powder material. The pressure-transmitting medium is solidified so as to retain its configuration and removed from the casting mold.

The pressure-transmitting medium includes a rigid interconnected skeletal structure which is collapsible when a predetermined force is applied. The skeletal structure may be of a ceramic-like material which is rigid and retains its configuration, but which may be broken up, crushed, fractionated or caused to flow at a predetermined relatively minimal force. The skeletal structure is defined by the ceramic material being interconnected to form a framework, latticework or matrix. The pressure-transmitting medium is further characterized by including a fluidizing means or material capable of fluidity and supported by and retained within the skeletal structure. The fluidizing material may, among other materials, be glass or elastomeric material. In other words, glass granules or particles are disposed in the openings or interstices of the skeletal structure so as to be retained and supported by the skeletal structure. A preferred transmitting medium may be formed by mixing a slurry of structural material in wetting fluid or activator with particles or granules of a fluidizing material dispersed therein.

The encapsulated, less than fully dense, material is heated to a compaction temperature prior to the densification. This can be done by placing the encapsulated container and powder in a furnace and raising it to a temperature at which compaction at the desired pressure or force will take place. During such heating, the glass or other fluidizing material supported by the skeletal structure softens and becomes fluidic and capable of plastic flow and incapable of retaining its configuration without the skeletal structure at the compaction temperature to which the powder has been heated for densification. However, the skeletal structure retains its configuration and rigidity at the compaction temperature. The heated pressure-transmitting medium may be handled without losing its configuration after being heated to the compaction temperature so it may be placed within a pot die. The pressure-transmitting medium which encapsulates the container and less dense powder is then placed in a press such as one having a cup-shaped pot die which has interior walls extending upward from the upper extremity of the pressure-transmitting medium. Thereafter, a ram of a press is moved downward in close-sliding engagement with the interior walls to engage the pressure medium. The ram therefore applies a force to a portion of the exterior pressure-transmitting medium while the pot die restrains the remainder of the pressure-transmitting medium so that the desired external pressure is applied to the entire exterior of the pressure-transmitting medium and the pressure-transmitting medium acts as a fluid to apply hydrostatic pressure to densify the powder to the desired densification. When the external pressure is applied on the pressure-transmitting medium, the skeletal structure is crushed and becomes dispersed within the fluidizing means such that the pressure applied is then directly transmitted by the fluidizing means to the container containing the powder to be densified.

Thereafter, the densified material encapsulated within the pressure-transmitting medium may be cooled. The pressure-transmitting medium may then be a rigid and frangible brick which may be removed from the container by shattering it into fragments, as by striking with a hammer or the like.

One preferred container useful for the densification of powdered binder material and refractory ceramic material using isostatic pressure is disclosed by U.S. Reissue Pat. No. 31,355 (relevant portions incorporated herein by reference). This patent discloses a container for hot consolidating powder which is made of substantially fully dense and incompressible material wherein the material is capable of plastic flow at pressing temperatures and that, if the container walls are thick enough, the container material will act as a fluid upon the application of heat and pressure to apply hydrostatic pressure to the powder. Under such conditions, the exterior surface of the container need not conform to the exterior shape of the desired refractory body prepared.

Such containers can be made of any material which retains its structural integrity but is capable of plastic flow at the pressing temperatures. Included among acceptable materials would be low carbon steel, other metals with the desired properties, glass, ceramics or combinations thereof. The choice of the particular material would depend upon the temperatures at which the particular binder material and refractory ceramic material would be densified. Generally, two pieces of the material which would be used to make the container are machined to prepare a mold which has upper and lower die sections. These are thereafter joined along their mating surfaces such that the upper and lower die sections form a cavity having a predetermined desired configuration. The size and shape of the cavity is determined in view of the final shape of the part to be produced. Before the upper and lower die sections are assembled, a hole is drilled in one of the die sections and a fill tube is inserted. After the fill tube has been attached, the two die sections are placed in a mating relationship and welded together. Care is taken during welding to ensure that a hermetic seal is produced to permit evacuation. Thereafter, the container is evacuated and filled with the powder to be densified through the fill tube. The fill tube is then hermetically sealed by pinching it closed and welding it.

Thereafter, the container is exposed to isostatic pressure at the desired binding and densification temperatures. This can be done by the methods described hereinabove. Alternatively, the filled and sealed container can be placed in an autoclave, and subjected to the temperatures and pressures desired for the binding and densification. The pressure in the autoclave on the container is isostatic and because the container is able to retain its configuration and has plastic-like tendencies, the container will exert isostatic pressure on the powders to be densified. The size of the cavity in the container will shrink until the powder therein reaches the desired density. After densification, the container can be removed from the autoclave and cooled. The container is then removed from the densified refractory material by pickling in a nitric acid solution. Alternatively, the container can be removed by machining or a combination of rough machining followed by pickling.

In the practice of the invention, a container is prepared as described in U.S. Reissue Pat. No. 31,355 described hereinabove and the isostatic pressure can be exerted on such container as described hereinabove. The container, once the powdered binder and refractory ceramic material are densified, is exposed to temperatures at which such container will melt without affecting the properties of the refractory body so prepared. Thereafter, the molten material or metal which has been melted away from the refractory body can thereafter be recycled to form a new container.

Other preferred methods of applying isostatic pressure through a pressure-transmitting medium to the ceramic preform are described in U.S. Pat. Nos. 3,455,682; 4,142,888; 4,094,709; 4,255,103; 3,230,286; 3,824,097; 4,023,966; 3,650,646; 3,841,870; 4,041,123; 4,077,109; 4,081,272; and 4,339,271. Relevant portions of these references are incorporated herein by reference.

In a preferred embodiment, the ceramic preform may be encapsulated in a protective barrier prior to placing the ceramic preform in a container as described hereinabove. The use of a barrier may prevent glass from penetrating into pores in the ceramic body during the hot pressing and may facilitate removal of the ceramic body from the glass/ceramic die because of differential expansion and barrier toughness. The protective barrier may be any metal which has a melting point greater than that of the glass/ceramic die, is substantially inert to the processing of the ceramic body and is plastically deformable. A preferred protective barrier may comprise tantalum, gold, platinum, other relatively inert metals and alloys thereof.

The ceramic bodies of this invention preferably have a density of about 85 percent or greater, more preferably about 90 percent or greater, even more preferably about 95 percent or greater, and most preferably about 100 percent. High density refers herein to a density of about 90 percent or greater of theoretical density.

The ceramic bodies of this invention preferably have an average grain size of about 100 microns or less; more preferably about 10 microns or less; still more preferably about 1 micron or less; and most preferably between 100 and 10,000 angstroms.

In one preferred embodiment, the refractory material comprises zirconium oxide stabilized with yttrium oxide. However, the zirconium oxide may be stabilized with any appropriate oxide. The zirconium oxide ceramic body of this invention exhibits greater Vickers hardness than known zirconium oxide ceramic bodies. Preferably, the zirconium oxide ceramic body of the present invention exhibits Vickers hardness greater than about 1200 kg/mm$^2$, more preferably greater than about 1300 kg/mm$^2$, and even more preferably greater than about 1450 kg/mm$^2$. The measurement of Vickers hardness of the ceramic bodies is done in accordance with methods known by those skilled in the art as described in the 1984 *Annual Book of ASTM Standards*, pp. 442–461, in accordance with ASTM E 384-73.

Specific Embodiments

The following examples are included for illustrative purposes only, and are not intended to limit the scope of the invention or claims. Unless otherwise stated, all parts and percentages are by volume.

EXAMPLE 1

A ceramic preform of zirconium oxide powder (10–50 microns) was formed using a uniaxial press at room temperature and Methocel ® as an external die lubricant. The resulting ceramic preform is heated for 2 hours at 200° C. to remove residual moisture resulting in a density of about 3.7 g/cm$^3$ (63 percent theoretical). The ceramic preform is placed in a ceramic/glass die and heated to about 1100° C. over a period of 2 hours. The heated ceramic preform contained in the die is thereafter placed in a press and subjected to about 120,000 psi of isostatic pressure for about 2 seconds. The ceramic body recovered has a density of about 5.4 g/cm³ (93 percent theoretical).

EXAMPLE 2

A ceramic preform of yttrium oxide stabilized zirconium oxide is formed by substantially the same process as in Example 1, resulting in a ceramic preform having a density of 3.5 g/cm³ (54 percent theoretical). The ceramic preform is encapsulated in tantalum foil, placed in a ceramic/glass die and heated in an argon purged furnace to about 1100° C. over a period of 2 hours. The ceramic preform contained in the die is placed in a press and subjected to about 120,000 psi of substantially isostatic pressure for about 2 seconds. Following densification, the ceramic body and die are heated for 1 hour at 500° C. in a nitrogen atmosphere so that the tantalum will form tantalum nitride thereby allowing its complete removal from the ceramic body. The ceramic body recovered has a density of about 5.8 g/cm³ (95 percent theoretical).

EXAMPLE 3

A ceramic preform of yttrium oxide stabilized zirconium oxide powder (10-50 microns) is formed using a uniaxial press (21,000 psi, 145 MPa) at room temperature without external die lubricants. The preform's density was about 2.8 g/cm³. The ceramic preform is placed in a Pyrex® cullet surrounded by a glass-/ceramic die and heated to about 1100° C. over a period of 1¼ hours in an argon atmosphere. The heated body is then isostatically pressed at 109,000 psi (752 MPa) for about 2 seconds. The ceramic body recovered has a density of 6.0 g/cm³ (99 percent theoretical). The ceramic body exhibits a Vickers hardness of 1302 kg/mm.

EXAMPLES 4-10

Examples 4-10 are formed by substantially the same process as in Example 1. The ceramic preforms contained in a ceramic/glass die are heated over a period of 2 hours to the indicated temperatures. The heated ceramic preforms are then placed in a press and subjected to about 120,000 psi of isostatic pressure for about 2 seconds. Table I lists the different refractory materials and process parameters used, (ksi equals 1,000 pounds/in²-psi) and the theoretical density of the resulting high density ceramic bodies.

TABLE I

| Material | Uniaxial Press (ksi) | External Die Lubricant | Pressing Temp. (°C.) | Percent of Theoretical Density |
|---|---|---|---|---|
| Magnesium Oxide | 58 | Methocel ® AB | 1400 | 100 |
| Aluminum Oxide | 58 | None | 1400 | 84 |
| Silicon Carbide | 39 | None | 1400 | 92 |
| Spinel | 20 | Zirconium Nitride | 1400 | 94 |
| Cordierite | 17 | Zirconium Nitride | 1250 | 95 |
| Barium Titanate | 39 | None | 1300 | 88 |
| Zirconium Oxide | 58 | Methocel ® AB | 1250 | 97 |
| Silicon Nitride | 60 | None | 1500 | 82 |

EXAMPLES 11 AND 12

Using substantially the procedure of Example 4, $Bi_{1.6}Er_{0.4}O_3$ and $Bi_{1.5}Y_{0.5}O_3$ are each precipitated from the nitrate salts, buffered at pH 8 with $NH_4OH/NH_4NO_3$, then the precipitates are oven dried 24 hours at 125° C. The two powders are separately fired 1 hour at 450°-550° C., cold-pressed (room temperature), in an uniaxial press at 40 ksi, into 1.25 cm diameter by 0.75 cm thick pellets (56-65 percent of theoretical density). Both ceramic preforms are then isostatically pressed at 800° C., 120,000 psi, for 2 seconds. The ceramic bodies recovered have a density of 88 to 93 percent of theoretical.

EXAMPLE 13 PREPARATION OF A SUPERCONDUCTING MATERIAL CONSOLIDATION

A mixture consisting of 112.9 grams of yttria, 329.7 grams of 93% barium monoxide (the remaining 7% constitutes barium hydroxide or barium carbonate) and 238.6 grams cupric oxide is dry milled at 60 rpm for about twelve hours using 350 cubic centimeters of high alumina content ceramic balls, commercially available under the trade designation Burundum TM from U.S. Stoneware Co., as a milling media in a 2000 milliliter wide mouth polyethylene jar. Approximately 220 grams of the mixture is transferred to a copper can having an internal diameter of 2¼ inches and a length of ⅞ inch. The can and its contents are heated in an air oven to a temperature of 850° C. and held at that temperature for twenty minutes. The can and its contents are then placed in a soda lime glass fluid pocket die, transferred to a forging press and subjected to about 120,000 psi of substantially isostatic pressure for a period of five seconds. After cooling, the copper can is removed to reveal a densified material having a green surface. The green surface is removed by grinding to reveal a black material which, when analyzed by x-ray diffraction, has the structure of the oxygen deficient tetragonal modification of $YBa_xCu_3O_{7-x}$. The material has a density of about 5.4 g/cm³ (about 88 percent of theoretical based upon the oxygen deficient structure). Densities as high as 5.79g/cm³ (about 94 percent of theoretical based upon the oxygen deficient structure) may be obtained with this consolidation process.

Annealing

Portions of the consolidated material are subjected to two different annealing programs with gaseous oxygen flowing past the portions at a rate of one inch per minute. One program, which does not produce a superconducting material, is as follows: heat the material at a rate of 10° C. per minute from 200° C. to 700° C.; cool the heated material at a rate of ¼° C. per minute from 700° C. to 500° C.; hold the material at 500° C. for thirty minutes; and cool the material at a rate of 10° C. per minute from 500° C. to 200° C. The second program, which does produce a superconducting material, is as follows: heat the material at a rate of 10° C. per minute from 200° C. to 800° C.; heat the material at a rate of ¼° C. per minute from 800° C. to 900° C.; hold the material at 900° C. for six hours: cool the heated material at a rate of 1° C. per minute from 900° C. to 600° C.; hold the material at 600° C. for one hour: cool the material at a rate of 1° C. per minute from 600° C. to 500° C.; hold the material at 500° C. for twenty minutes: and cool the material at a rate of 10° C. per minute from 500° C. to 200° C.

Verification of Superconductivity

The annealed samples are placed in a magnetometer to verify the presence or absence of superconductive phases. The sample annealed according to the first program exhibits no superconductivity. The sample annealed according to the second program provides a diamagnetic signal of 24% of the theoretical value ($\frac{1}{4}\pi$ emu/cc). The signal disappears upon heating the material above 94° K.

The foregoing results show the importance of the annealing conditions. It is believed that heating above 800° C., preferably in the range of 850° C. to 875° C., is necessary if superconductivity is to be attained. It is also believed that heating above about 900° C. during annealing may lead to formation of parasitic melt phases such as $Ba_3Cu_5O_8$ which may lower critical current density. Similar results are obtained with other compositions and process variations within the scope of the present invention.

What is claimed is:

1. A method for preparing a superconducting ceramic article comprising:
   a. heating a powdered admixture comprising (1) a source of yttria ($Y_2O_3$), (2) a source of barium monoxide and (3) a source of cupric oxide to a temperature of from about 800° Centigrade to 900° Centigrade to allow the admixture to be densified under pressure to more than about 65 percent of the admixture's theoretical density but low enough to substantially preclude melting of the admixture;
   b. applying to said heated admixture isostatic pressure of between about 80,000 psi ($5.5 \times 10^2$ MPa) and about the fracture stress of said heated admixture, for a period of time of from about 0.1 second to about ten minutes to form a densified article with a density of more than about 65 percent of the admixture's theoretical density; and
   c. Annealing the densified article in the presence of gaseous oxygen under conditions sufficient to convert said densified article to a superconducting ceramic article having a composition comprising $YBa_2Cu_3O_{7-x}$ where $0 < x < 0.6$.

2. The method of claim 1 wherein, prior to step a, the powdered admixture is placed in a container formed from a material which is substantially fully dense and incompressible at room temperature but capable of plastic flow at elevated temperatures and pressures, said container having defined therein a cavity which has a shape approximating that of the article.

3. The method of claim 2 wherein the material is copper.

4. The method of claim 1 wherein, prior to step b, the powdered admixture is at least partially contained in a pressure-transmitting medium which is fluidic when subjected to the pressure of said step b.

5. The method of claim 4 wherein, prior to step a, the powdered admixture is placed in a container formed from a material which is substantially fully dense and incompressible at room temperature but capable of plastic flow at elevated temperatures and pressures, said container having defined therein a cavity which has a shape approximating that of the superconductive article.

6. The method of claim 1 wherein the isostatic pressure is between about 90,000 psi ($6.2 \times 10^2$ MPa) and about 120,000 psi ($8.3 \times 10^2$ MPa).

7. The method of claim 1 wherein the period of time is from about ten seconds to about five minutes.

8. The method of claim 1 wherein the densified article has a density of more than about 85 percent of the admixture's theoretical density.

9. The method of claim 1 wherein the densified article has a density of more than about 90 percent of the admixture's theoretical density.

10. The method of claim 1 wherein the densified article has a density of more than about 95 percent of the admixture's theoretical density.

11. The method of claim 1 wherein the source of yttria is selected from the group consisting of yttria, yttrium acetate, yttrium carbonate, yttrium nitrate hexahydrate and yttrium nitrate tetrahydrate.

12. The method of claim 1 wherein the source of barium monoxide is selected from the group consisting of barium monoxide, barium acetate, barium acetate hydrate, barium peroxide, barium carbonate($\alpha$), barium carbonate($\beta$), barium carbonate($\gamma$), and barium nitrate.

13. The method of claim 1 wherein the source of cupric oxide is selected from the group consisting of cupric oxide, cuprous oxide, copper acetate, copper carbonate, copper nitrate hexahydrate and copper nitrate trihydrate.

14. The method of claim 1 wherein a(2) is barium monoxide and a(3) is cupric oxide.

15. The method of claim 1 wherein the annealing conditions include heating the densified article to a temperature of from about 800° Centigrade to about 900° Centigrade.

16. The method of claim 15 wherein the annealing conditions further comprise slowly cooling the heated, densified article, in the presence of gaseous oxygen, to a temperature of about 500° Centigrade, said cooling being at a rate of cooling which is sufficiently low to allow the densified article to absorb enough oxygen to render the article superconductive.

17. The method of claim 15 wherein the rate of cooling of from about 0.5° to about 1.5° Centigrade per minute.

18. The method of claim 1 further comprising a step d wherein the cooled, densified article is held at a temperature of from about 400° Centigrade to about 500° Centigrade in the presence of oxygen for a period of time sufficient to further increase the oxygen content of the densified article, said time period being from about 15 minutes to about 48 hours.

* * * * *